United States Patent [19]
Imamura et al.

[11] Patent Number: 4,874,086
[45] Date of Patent: Oct. 17, 1989

[54] FILM CARRIER AND A METHOD FOR MANUFACTURING A SEMICONDUCTOR DEVICE UTILIZING THE SAME

[75] Inventors: Makoto Imamura; Ryouichi Miyamoto, both of Kawasaki, Japan

[73] Assignee: Kabushiki Kaisha Toshiba, Kawasaki, Japan

[21] Appl. No.: 196,670

[22] Filed: May 20, 1988

[30] Foreign Application Priority Data

Jun. 8, 1987 [JP] Japan ................................. 62-141392

[51] Int. Cl.⁴ ........................................... H01L 39/02
[52] U.S. Cl. ..................................... 206/330; 357/80; 357/70
[58] Field of Search ............................ 357/70, 80, 81; 206/330

[56] References Cited

U.S. PATENT DOCUMENTS

| | | | |
|---|---|---|---|
| 3,469,684 | 9/1969 | Keady et al. | 206/330 |
| 3,659,821 | 5/1972 | Sakamoto et al. | 206/330 |
| 3,858,721 | 1/1975 | Boyer et al. | 206/330 |
| 4,417,266 | 11/1983 | Grabbe . | |
| 4,496,965 | 1/1985 | Orcutt et al. . | |

*Primary Examiner*—Joseph Man-Fu Moy
*Attorney, Agent, or Firm*—Oblon, Spivak, McClelland, Maier & Neustadt

[57] ABSTRACT

A film carrier for a semiconductor device tested with a tester having a plurality of test pins arranged with predetermined interval, comprises a film substrate of insulating material. A plurality of conductive leads are arranged on the film substrate with predetermined spacing with respect to an adjacent one. Each lead has testing lead portion and circuit lead portion. The spacing between the adjacent testing lead portion is larger than the spacing between the adjacent circuit lead portion. The testing lead portion is removed partially from the conductive lead after an efficiency test.

9 Claims, 4 Drawing Sheets

FILM CARRIER AND A METHOD FOR MANUFACTURING A SEMICONDUCTOR DEVICE UTILIZING THE SAME

BACKGROUND OF THE INVENTION

1. Field of the Invention

This invention relates to a film carrier for forming a film carrier type semiconductor device by packaging a semiconductor integrated circuit chip therewith, and more particularly to a pattern of conductive leads formed on a film carrier substrate. Furthermore, this invention relates to a method for manufacturing a semiconductor device utilizing the film carrier.

2. Description of the Prior Art

To improve the mounting density of a semiconductor integrated circuit device, the film carrier type semiconductor device has been widely used.

FIG. 1 shows an example of conventional film carrier packaged with a semiconductor integrated circuit chip. In the drawing, the numeral 51 denotes a film carrier substrate made of insulating material, e.g., glass epoxyresin, of 0.2mm thickness. The numeral 52 denotes a semiconductor body wherein a semiconductor integrated circuit chip (not shown) is packaged. The numeral 53 denotes sprocket holes used, for example, for fixing the film carrier to a manufacturing apparatus (not shown) during the fabrication. The numeral 54 denotes a plurality of conductive leads made of conductive material, e.g., copper leaf. The leads 54 are arranged in parallel with each other with a predetermined spacing P2. The numeral 55 denotes a punching hole formed in the film substrate 51. After a efficiency test, the conductive leads 54 are cut along the dashed line 50 to produce a semiconductor device having outer leads by separating a semiconductor body 52 from the film carrier substrate 51. In the efficiency test, test pins of a tester socket terminal area attached to the corresponding conductive leads 54 on the substrate 51 for avoiding the deformation of the conductive leads 54 by the stress of tester pins of the tester socket terminal.

FIG. 2 shows an example of a conventional tester socket terminal for the efficiency test of the semiconductor device FIG. 2A is a plan view and the FIG. 2B is a cross sectional view along the line I—I in FIG. 2A. The socket terminal body 60 is made of insulating material, e.g., plastic material In the body 60, a plurality of slits 63 are formed. In each slit 63, a contact test pin 61 is prepared. Each contact test pin 61 has outer lead portion 61a and spring portion 61b. The spring portion 61b gives preferable stress to the conductive lead 54 of the semiconductor device when the semiconductor device is contacted with the tester terminal 60. To the outer lead portion 61a of the contact test pins 61, predetermined test data is fed to test the quality of the semiconductor device. To form the slit 63 in this tester terminal, walls 62 are required. In the present production technique, a 0.45 mm minimum width is required for the wall 62 to secure the insulation between the adjacent contact leads 61, and for the strength of the wall 62.

The more the use of the carrier device has spread, the more the requirement of users for higher mounting densities has also increased. In the conventional film carrier, the conductive leads 54 are parallel throughout the portion out of the semiconductor body 52. Thus, the spacing P2 of the outer leads of the semiconductor device is equal to the spacing P1 of the tester socket terminal. The spacing of outer leads of the semiconductor device may be reduced with the progress of itnergration techniques for semiconductor chips. However, to test the device with the conventional tester socket terminal, in the conventional way, the reduction of the spacing of the device is restricted by the spacing of the test pins of the tester socket terminal. Thus the mounting density is also restricted.

SUMMARY OF THE INVENTION

An object of the present invention is to provide an improved film carrier which permits high mounting density of the semiconductor device in spite of the limitation of spacing of the test pins of the tester socket terminal.

Another object of the invention is to provide an improved method for manufacturing a semiconductor device utilizing the improved film carrier.

This invention provides a film carrier for a semiconductor device being tested in a tester having a plurality of test pins arranged in at least one group of test pins with a predetermined interval between adjacent pins, having a plurality of conductive lead means for electrical connection with the semiconductor device, wherein the conductive lead means comprises: testing lead portion means for contacting the tester pins during testing of the semiconductor device; and circuit lead portion means for connecting the semiconductor device to a circuit after removal of at least part of the testing lead portion means from the conductive lead means following testing, including a plurality of substantially parallel circuit lead segments having a predetermined space therebetween, the space being smaller than the interval between adjacent test pins.

Furthermore, a method for producing a semiconductor device utilizing the film carrier is also described.

BRIEF DESCRIPTION OF THE DRAWINGS

The accompanying drawings, which are incorporated in and constitute a part of the specification, illustrate an embodiment of the invention, and, together with the description, serve to explain the principles of the invention. Of the drawings.

DESCRIPTION OF THE PREFERRED EMBODIMENTS

Figure 3:
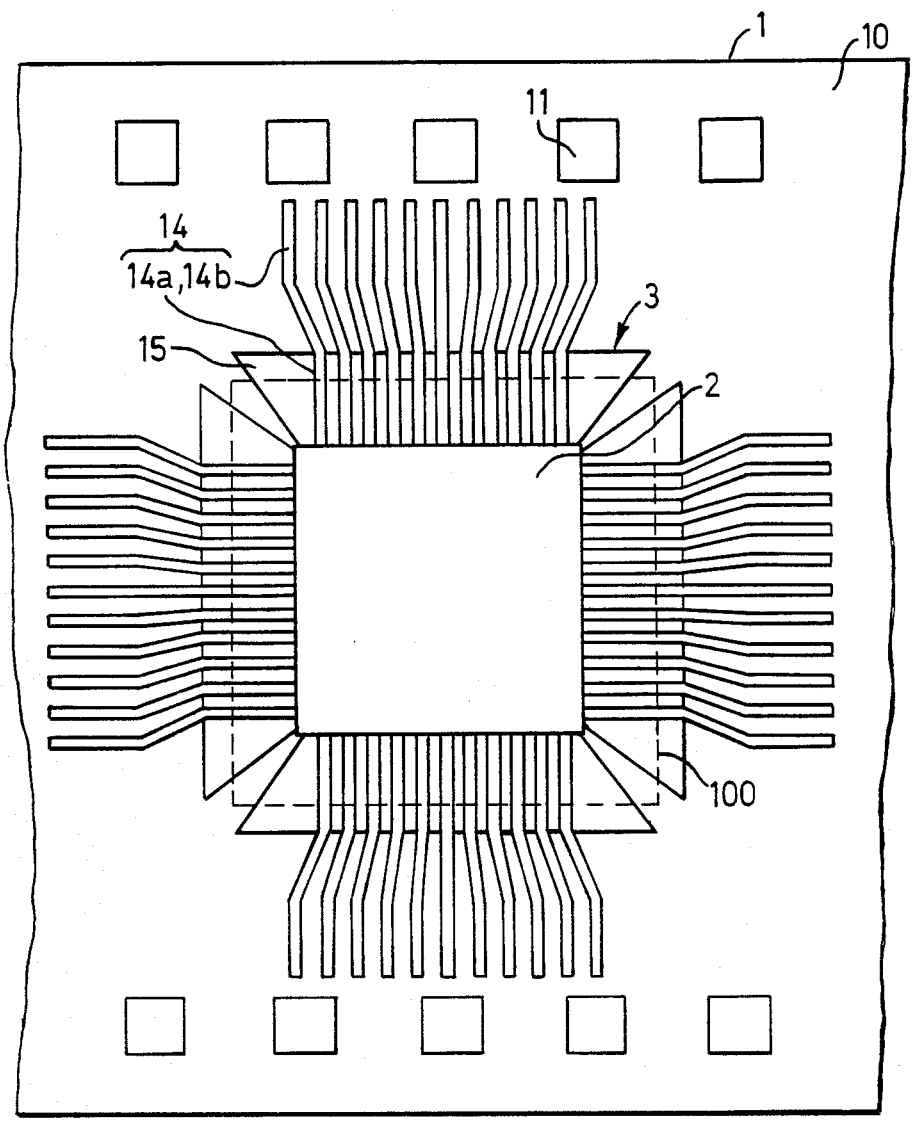
FIG. 3 shows a plan view of a film carrier in accordance with this invention, including a packaged semiconductor chip therewith.

FIG. 3 shows an example of a film carrier which has a semiconductor body 2 packaging a semiconductor chip (not shown) at the central portion thereof with a constant space to an adjacent one (not shown) in the longitudinal direction of the film carrier substrate 10.

Figure 1:
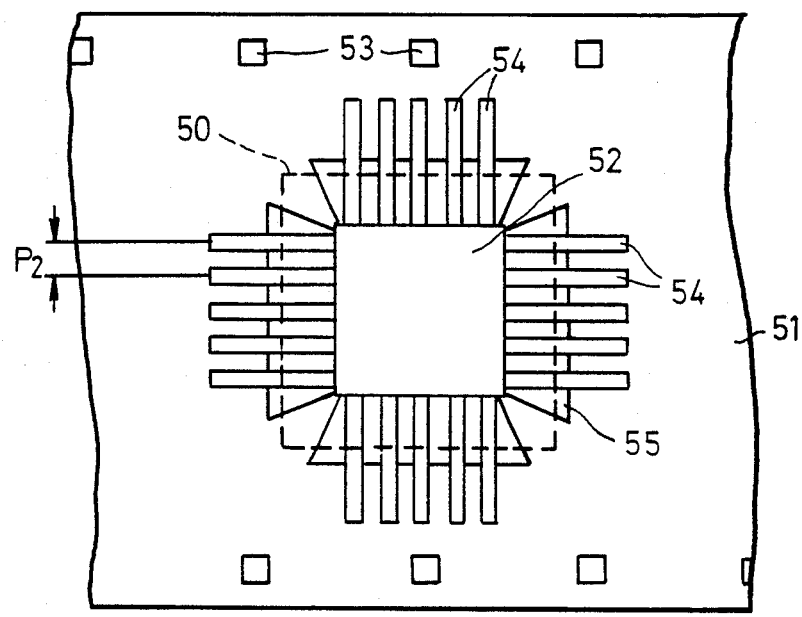
FIG. 1 shows a plan view of conventional film carrier including a packaged semiconductor chip therewith.
Figure 2A:
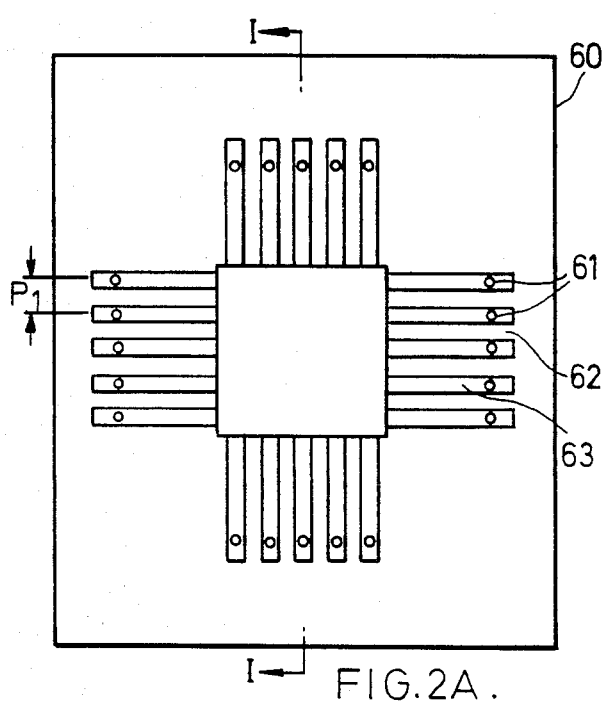
FIG. 2 shows a plan view and a cross sectional view of conventional tester socket terminal used for the test of a film carrier type semiconductor device.
Figure 2B:
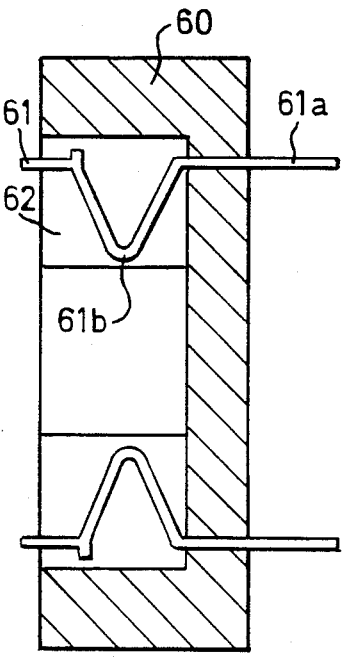
Figure 4:
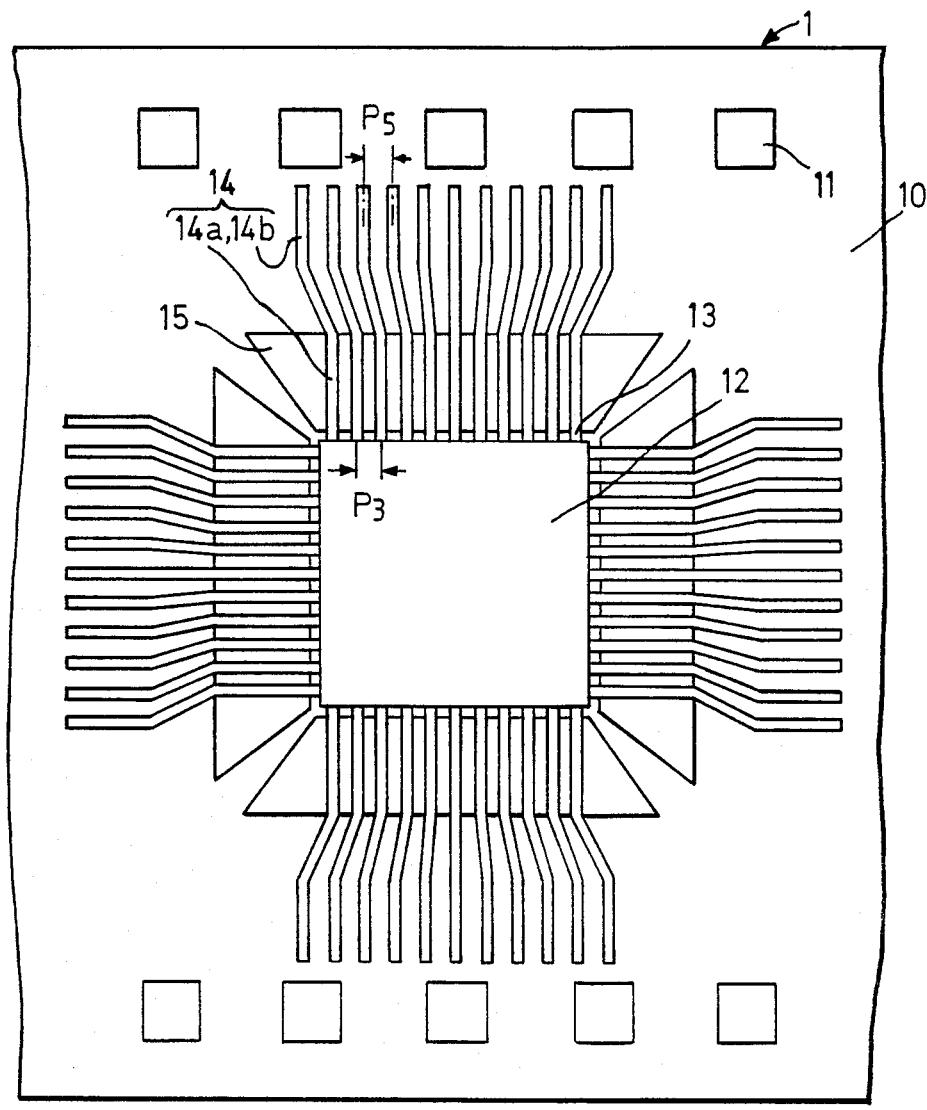
FIG. 4 shows a plan view of film carrier in accordance with this invention.

FIG. 4 shows a plan view of the film carrier before the packaging process of the semiconductor chip. The width of the film carrier substrate 10 is about 35 mm, and comprises a plurality of sprocket holes 11 formed at the both sides of the film carrier substrate 10 along the edge thereof. At the central portion of the film carrier substrate 10, a square hole 12 for locating a semiconductor chip is formed with a constant spacing to an adjacent holes (not shown). Around the square hole 12, a plurality of conductive leads 14 made of e.g., copper leaf are provided. These leads are formed by patterning a copper sheet positioned on the substrate 10 into predetermined shape. The conductive leads extend from four sides of the square hole 12 radially. Each conductive lead 14 has first and second parallel portions 14a and 14b. At these portions, the conductive leads are arranged in parallel with each other with constant spacings P3 and P5 respectively. The spacing P5 at the second parallel portion 14b is incident to the spacing P1 of the test pins of the tester terminal. In the production process of the film carrier type semiconductor device, a semiconductor chip (not shown) is positioned at the central portion of the hole 12. For making electrical connection between the semiconductor chip and the pad portions 13 of the conductive leads 14, a bonding wire process between the semiconductor chip and the pad portion 13 of each conductive lead 14 is performed, for example. Of course, other well known wireless bonding techniques, e.g., bump construction, may be used for the electrical connection between the semiconductor chip and the conductive leads. Next, the semiconductor chip, the bonding wires and the pad portions of conductive leads 14 are packaged with plastic resin, e.g., by a potting process, to form a semiconductor body 2 like that shown in FIG. 1. By this process, a film carrier device as shown in FIG. 3 is produced. In the state shown in FIG. 3, the conventional tester terminal 60 of FIG. 2 is applied to test the quality of the device. In this test, each contact test pin of the tester socket terminal contacts a corresponding conductive lead 14 on the second parallel portion 14b. As the second parallel portion 14b is on the film carrier substrate 10, each lead 14 is safe from deformation by the stress of tester pin of the tester socket terminal. Next, a cutting process is performed along the dashed line 100 to separate the semiconductor device from the film carrier. The remaining portions of the conductive leads 14 to the semiconductor body 2, or portions within the dashed line 100 of the first parallel portion of the conductive leads 14, function as outer leads of the semiconductor device. The punching hole 15 gives flexibility to the assembly of the semiconductor device on a device mounting board (not shown). Namely, the punching hole 15 exposes the rear face of each conductive lead 14. Thus, each conductive lead 14 can be connected electrically through the punching hole to other circuit elements (not shown). Consequently, it is possible to mount the semiconductor device upside down. In the film carrier 1, even if the spacing P5 of second parallel portion 14b is restricted by the spacing of the test pins of the tester socket terminal, it is possible to reduce the spacing P3 of first parallel portion 14a. As the semiconductor device is cut along the dashed line 100, namely at the narrow spacing portion of the conductive lead, the size of the semiconductor device is minimized. As a result, the mounting density is increased. If the spacing P5 is set to equal to that of a mini-flat package device, the semiconductor device can be tested with the tester socket terminal for the mini-flat package device. In this case, if the conductive leads are cut at the second parallel portion 14b, the produced semiconductor device can be treated in the same manner as the mini-flat package device.

Figure 5:
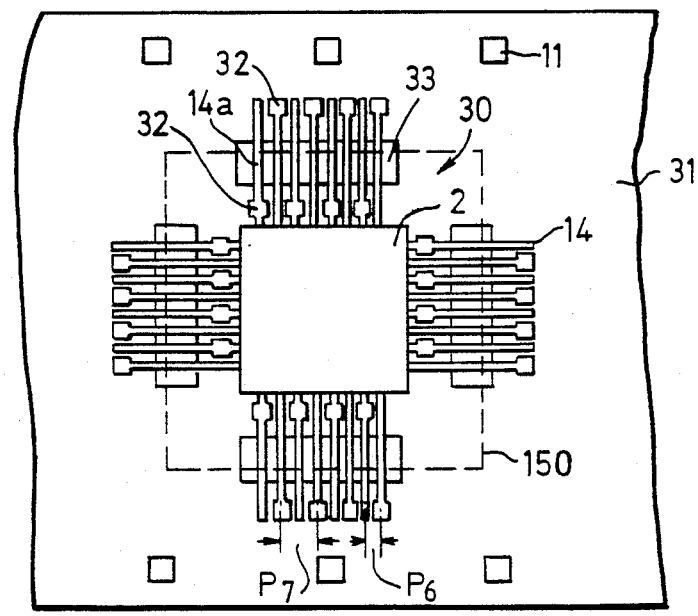
FIG. 5 shows a plan view of another film carrier in accordance with this invention, including a packaged semiconductor chip therewith.

FIG. 5 shows a plan view of semiconductor device of another embodiment of this invention. In this embodiment, a plurality of conductive leads 14 extend from the four sides of semiconductor body 2. Each conductive lead 14 has a wide portion 32 alternately near the semiconductor body 2 or on opposite end portion. The conductive leads 14 are arranged in parallel with constant spacing P6 throughout the portion out of the semiconductor body 2. To these wide portions, corresponding test pins of the tester socket terminal are attached. The punching holes 33 are formed in the substrate 31 corresponding to the central portion of the conductive leads 14. To similar to the first embodiment shown in FIG. 3, the conductive leads 14 are cut along the dotted line 150 after the efficiency test to produce a semiconductor device. The conductive leads 14 within the dotted line 150, those remaining on the semiconductor body 2, function as outer leads of the semiconductor device.

Figure 6A:
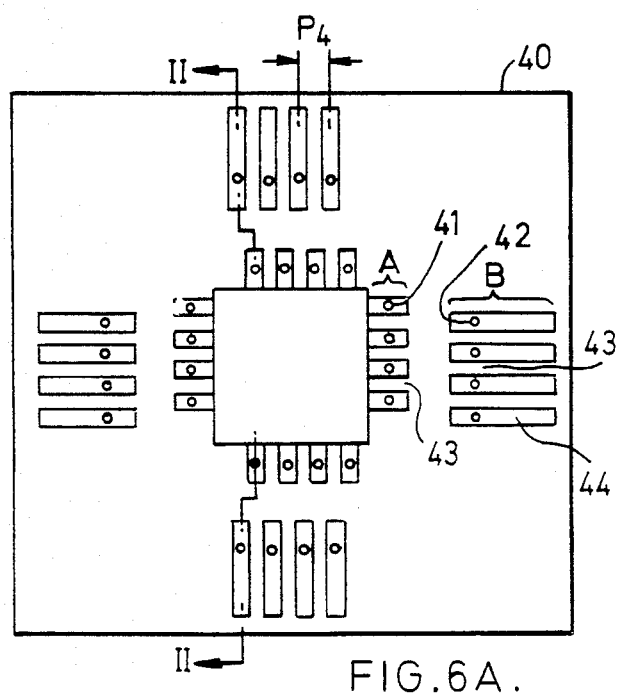
FIGS. 6A and 6B show a plan view and a cross-sectional view respectively, of improved tester socket terminal for testing the film carrier type semiconductor device shown in FIG. 5.
Figure 6B:
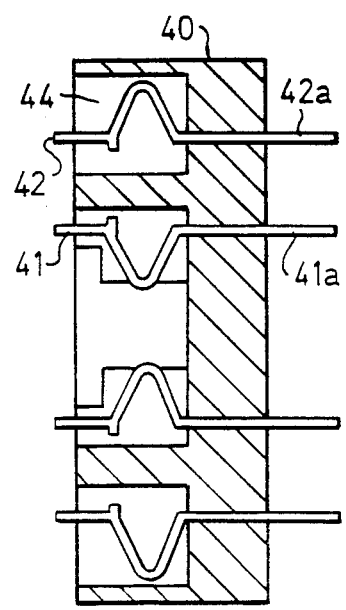

FIG. 6 shows an improved tester socket terminal for the test of device shown in FIG. 5. In the tester socket terminal, a plurality of test pins 41, 42 are arranged in four sides corresponding to the conductive leads (14) of the film carrier. In each side, the test pins 41, 42 are separated into two groups, A and B corresponding to the wide portions 32 of conductive leads 14, so as to make contact thereto. Each test pin 41, 42 is prepared in a slit portion 44. The slit 44 is separated by a wall 43. In this tester socket terminal, the test pins are prepared alternately in the A or B group. The spacing P4 of the adjacent test pins in each group A or B is incident to the spacing P7 of the wide portions 32 of alternate conductive leads 14. Even if the spacing P4 of the test pins 41, 42 is wide, the spacing P6 of the conductive leads 14 is half of the spacing P7. Thus the spacing of conductive lead 14 is reduced keeping enough width for the wall 43. In other words, when the spacing P4 of the test pin is set to 0.45 mm, similar to the conventional tester socket terminal, the spacing P6 of the conductive lead 14 can be reduced to half of the spacing P4. Thus, in spite of the restriction of the spacing of tester socket terminal, the spacing of the outer leads of the semiconductor device is minimized. As a result, high integration of the semiconductor device and higher mounting density are achieved.

The present invention has been described with respect to a specific embodiment. However, the embodiment based on the principles of the present invention should be obvious to those or ordinary skilled in the art. Such embodiments are intended to be covered by the claims.

What is claimed is:

1. A film carrier for a semiconductor device being tested in a tester having a plurality of test pins arranged in at least one group of test pins with a predetermined interval between adjacent pins, comprising:

a film substrate; and
conductive lead means supported by the substrate for electrical connection with the semiconductor device, including
(i) temporary testing lead portion means for contacting the test pins during testing of the semiconductor device, including a plurality of substantially parallel test segments with a predetermined gap between adjacent test segments, and (ii) circuit lead portion means for connecting the semiconductor device to a circuit after removal of the test segments from the conductive lead means following testing, including a plurality of substantially parallel circuit segments with a predetermined space between adjacent circuit segments, the space being smaller than the gap.

2. The film carrier of claim 1, wherein the predetermined interval is equal to the predetermined gap.

3. The film carrier of claim 2, wherein the film substrate includes an opening at least partially aligned with the circuit segments.

4. A film carrier for a semiconductor device being tested in a tester having a plurality of test pins arranged in at least one group of test pins with a predetermined interval between adjacent pins, comprising:
  a film substrate;
  conductive lead means supported by the substrate for electrical connection with the semiconductor device, comprising
    (i) circuit lead portion means for connecting the semiconductor device to a circuit, including a plurality of substantially parallel circuit segments with a predetermined space therebetween,
    (ii) testing lead portion means for contacting the test pins during testing of the semiconductor device, including test pad means alternately positioned on the circuit lead portion means for minimizing the space between adjacent circuit segments.

5. The film carrier of claim 4, wherein the film substrate includes an opening at least partially aligned with the circuit segments.

6. In a film carrier for a semiconductor device being tested in a tester having a plurality of test pins arranged in at least one group of test pins with a predetermined interval between adjacent pins, having a plurality of conductive lead means for electrical connection with the semiconductor device, wherein the conductive lead means comprises:
  testing lead portion means for contacting the tester pins during testing of the semiconductor device; and
  circuit lead portion means for connecting the semiconductor device to a circuit after removal of at least part of the testing lead portion means from the conductive lead means following testing, including a plurality of substantially parallel circuit lead segments having a predetermined space therebetween, the space being smaller than the interval between adjacent test pins.

7. The film carrier of claim 6, wherein the film substrate includes an opening at least partially aligned with the circuit lead segments.

8. The film carrier of claim 6, wherein the testing lead portion means arranged with a predetermined gap between adjacent testing lead portion, the circuit lead portion being arrangead with a predetermined space between the adjacent circuit lead portion, the gap being larger than the space and being incident to the interval between adjacent test pins.

9. The film carrier of claim 6, wherein the testing lead portion means including test pad means alternately positioned on the conductive lead means for minimizing the space between adjacent circuit lead portion means.

* * * * *